US 9,362,356 B2

(12) United States Patent
O hAnnaidh et al.

(10) Patent No.: US 9,362,356 B2
(45) Date of Patent: Jun. 7, 2016

(54) TRANSISTOR

(71) Applicant: ANALOG DEVICES GLOBAL, Hamilton (BM)

(72) Inventors: Breandan Pol Og O hAnnaidh, Raheen (IE); Seamus Paul Whiston, Raheen (IE); Edward John Coyne, Athenry (IE); William Allan Lane, Waterfall (IE); Donal Peter McAuliffe, Raheen (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/539,593

(22) Filed: Nov. 12, 2014

(65) Prior Publication Data

US 2016/0133701 A1     May 12, 2016

(51) Int. Cl.
| | |
|---|---|
| *H01L 29/66* | (2006.01) |
| *H01L 29/06* | (2006.01) |
| *H01L 29/78* | (2006.01) |
| *H01L 29/417* | (2006.01) |
| *H01L 29/423* | (2006.01) |

(52) U.S. Cl.
CPC ...... *H01L 29/0692* (2013.01); *H01L 29/41758* (2013.01); *H01L 29/42376* (2013.01); *H01L 29/66568* (2013.01); *H01L 29/78* (2013.01)

(58) Field of Classification Search
CPC ............... H01L 2924/00; H01L 2224/48247; H01L 2224/48465; H01L 2224/49111; H01L 2224/49171; H01L 2924/00014; H01L 2224/4903; H01L 2224/05599; H01L 2224/05647; H01L 2224/48137; H01L 2224/49431; H01L 29/0692; H01L 29/41758; H01L 29/42376; H01L 29/66568; H01L 29/78
USPC .................. 257/194, 170, 156, 488, E29.181, 257/E29.187
See application file for complete search history.

(56) References Cited

U.S. PATENT DOCUMENTS

| | | | | |
|---|---|---|---|---|
| 3,615,934 | A * | 10/1971 | Bower | 438/307 |
| 5,973,367 | A * | 10/1999 | Williams | 257/365 |
| 7,323,747 | B2 * | 1/2008 | Ikuta | H01L 29/0696 257/288 |
| 7,368,785 | B2 * | 5/2008 | Chen | H01L 29/407 257/288 |
| 2007/0132019 | A1 * | 6/2007 | Dietz et al. | 257/335 |
| 2009/0242930 | A1 * | 10/2009 | Lu | 257/141 |
| 2012/0299096 | A1 * | 11/2012 | Huo et al. | 257/343 |

* cited by examiner

*Primary Examiner* — Tod T Van Roy
*Assistant Examiner* — Vu A Vu
(74) *Attorney, Agent, or Firm* — Knobbe, Martens, Olson & Bear, LLP

(57) ABSTRACT

A transistor is provided in which an elongate drain region has end portions formed in parts of the transistor where features of the transistor structure have been modified or omitted. These structures lessen the current flow or electric field gradients at the end portions of the drain. This provides a transistor that has improved on-state breakdown performance without sacrificing off state breakdown performance.

21 Claims, 13 Drawing Sheets

TRANSISTOR

TECHNICAL FIELD

The present disclosure relates to a transistor having a modified structure to improve its on-state breakdown voltage, and to integrated circuits including one or more of such transistors. The provision of a higher break-down voltage, especially when the transistor is conducting, is a significant improvement in the usability of transistors.

BACKGROUND

It is often desirable to increase the voltage that a transistor fabricated using a given process can withstand before breakdown of the transistor occurs. Many workers have concentrated on techniques and modifications to improve the off state breakdown voltage of a transistor, which is the maximum voltage that the transistor can withstand whilst being nominally non-conducting. However, depending on the specific configuration of circuits that a transistor is used in, a transistor may experience a voltage across it when it is in a conducting state as well. It would be desirable to improve the on state breakdown characteristics of a transistor without adversely affecting its off state breakdown characteristics.

SUMMARY

According to a first aspect of this disclosure there is provided a transistor which has been modified to enhance its on state breakdown performance. The transistor comprises a first region of semiconductor, a second region of semiconductor, and a gate located between the first and second regions of semiconductor. The first region of semiconductor may act as a drain of the transistor, and the second region of semiconductor may act as the source of the transistor or vice versa. The transistor may be modified such that end portions of one or both of the first and second semiconductor regions lie in regions of reduced current flow or reduced electric field intensity. This may for example be formed by increasing a distance between an end section of one of the semiconductor regions and one or more of the gate or other semiconductor region. Thus the gate might be made shorter or longer than, for example, the drain of the transistor. Additionally or alternatively portions of the source may be omitted. Thus end portions of the drain are in regions of reduced transistor activity and consequently subjected to less current crowding or field intensity.

Preferably the first region of semiconductor has a first length, the second region of semiconductor has a second length, and the gate has a third length. In one embodiment the length of the gate is greater than the length of the first region and is greater than the length of the second region. Thus, in this example, the gate is longer than the drain and longer than the source.

Advantageously, the transistor is formed in a torroidal or race-track like shape such that the first region which may function as the drain is provided as an elongate region at a center line of the transistor, and the gate encircles or substantially encircles the first region. In this context "encircles" does not mean that the gate is circular, but rather than it surrounds the drain within one plane of the device. Thus the gate may comprise two elongate gate sections that run parallel with the first region, and semicircular or polygonal approximations to a semicircle that join the elongate elements together at opposing ends thereof. Thus, in this example, the gate when viewed from above forms an elongate loop.

The second region of semiconductor, which may function as the source, is provided to the outside of the gate (i.e. away from the center line) and, preferably, does not form a continuous loop encircling the gate. Thus the source can be regarded as being formed by a first source region and a second source region. The first and second source regions may be deposited either side of the drain, and parallel with the drain. The source and drain can be swapped, and in such a device there are first and second drain regions either side of the source.

In accordance with a second aspect of this disclosure there is provided a method of forming a transistor comprising forming an elongate first region between first and second elongate second regions, and forming a gate region between the first and the second regions, where the gate extends past or falls short of end sections of the first and second regions.

The first region advantageously is a drain region of a transistor, and the second regions are the source of the transistor.

BRIEF DESCRIPTION OF THE DRAWINGS

Embodiments of this disclosure will now be described by way of non-limiting example for the purposes of illustration only with respect to the accompanying drawings, in which.

DETAILED DESCRIPTION OF CERTAIN EMBODIMENTS

Figure 1:
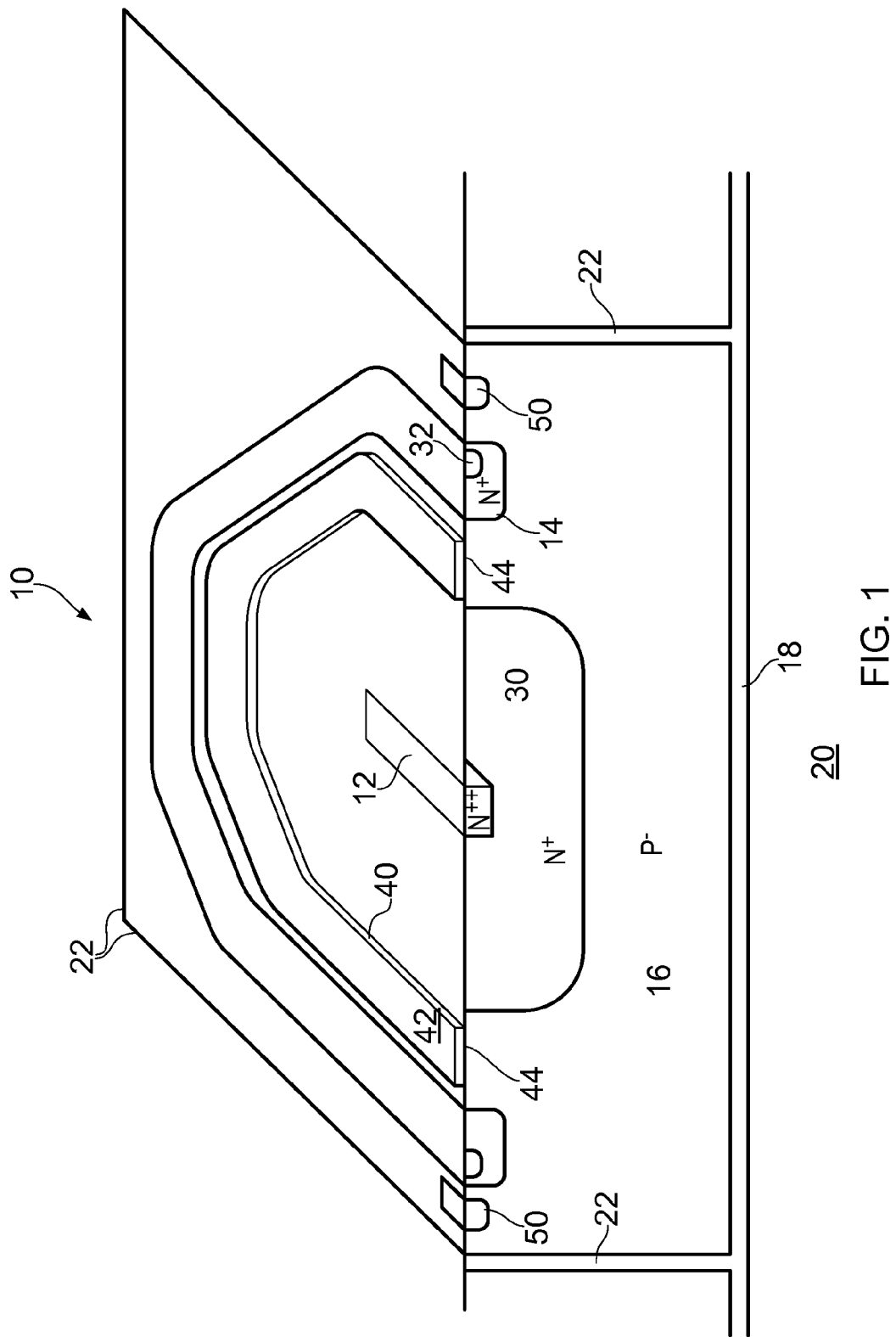
FIG. 1 is a cross-sectional and semi-perspective view of an end section of a transistor having a relatively high off state breakdown voltage.

FIG. 1 is a cross sectional diagram showing a construction of a field effect transistor together with the shape of the drain, source and gate regions thereof. The field effect transistor, generally designated 10 comprises a first region of semiconductor 12 which is relatively highly doped and which in this example will serve to form the drain of the transistor 10. The transistor 10 further comprises a second doped semiconductor region 14 which is disposed as a loop around the drain 12. The region 14 acts, in this example, as a source of the transistor 10. For a "high voltage" transistor it is generally desirable to form the drain 12 and source 14 within an isolated well of semiconductor 16 which forms the body of the transistor 10. The body of the transistor may be isolated from other devices and the rest of the semiconductor substrate by known techniques such as forming reverse biased wells, or as illustrated in FIG. 1 by using silicon on insulator fabrication techniques to form a body 16 which sits above an insulating layer 18 formed over a carrier substrate 20, and which is also bounded on all sides by insulating walls 22. Such insulating walls 22 may be formed by etching trenches and then filling them with a suitable dielectric as known to the person skilled in the art.

Typically the first semiconductor region 12 which forms a drain is very highly doped. For a N-type field effect transistor the drain region 12 may be highly doped, and this is typically designated $N^{++}$. This highly doped drain region 12 may be surrounded by a drain extension region 30 which serves to make the drain more spatially extensive. The drain extension region 30 is relatively highly doped and is less highly doped than the highly doped drain region 12. The illustrated drain extension region is also formed of a N-type semiconductor, but which is less highly doped than the highly doped drain region 12, as indicated $N^+$ in FIG. 1.

The use of a relatively wide drain allows the electric field gradients within the drain to be reduced, thereby reducing the risk of impact ionization initiated breakdown of the transistor. Similarly, the use of a relatively expansive drain also reduces the current density at the interface between the drain of the transistor and a channel of the transistor, said channel being formed adjacent and beneath the gate.

For the N-type transistor shown in FIG. 1, the body 16 of the transistor is formed by a relatively lightly doped P-type region, designated $P^-$ in FIG. 1.

The source 14 is also formed of an N-type material, and typically includes a highly $N^{++}$ doped contact region 32 therein. The use of highly doped regions 12 and 32 reduces Ohmic resistance with metallic contacts to the transistor 10.

A gate, generally designated 40, is formed between the extended drain region 30 and the source 14. Gate construction depends on whether the transistor is an insulated gate field effect transistor or a junction field effect transistor. For an insulated device, the gate 40 comprises a conductive element 42 positioned adjacent to the surface of the P-type semiconductor 16, but insulated therefrom by a dielectric 44. The dielectric 44 is typically formed as a thermal oxide on the surface of the P-type substrate 16. The conductive element 42 may be metal, or may be a further semiconductor, such as doped polysilicon. However, this transistor construction is still known as a metal oxide semiconductor field effect transistor (MOSFET), despite the fact that the gate need not be metal.

In the case of a junction field effect transistor (JFET), the gate is provided as an implanted region without a dielectric separating it from the body 16. Similarly, since a JFET is often provided as a depletion mode device, the first and second regions may be provided with the same doping type, e.g. P-type, as the bulk region and the gate doping is the opposite doping type, e.g., N-type, or vice versa. It will be understood that any of the devices discussed herein can alternatively be implemented by swapping all N-type regions for P-type regions and swapping all P-type regions for N-type regions.

Since a FET is in fact a four terminal device, connections can be made to the body 16 of the device, which serves as a "back gate" and these connections are made via P-type implants 50. The implants 50 may be made as one or more islands within the body 16 as shown in FIG. 1 or in the form of a trench that encircles the source 14 of the transistor 10 as shown in FIG. 2.

Figure 2:
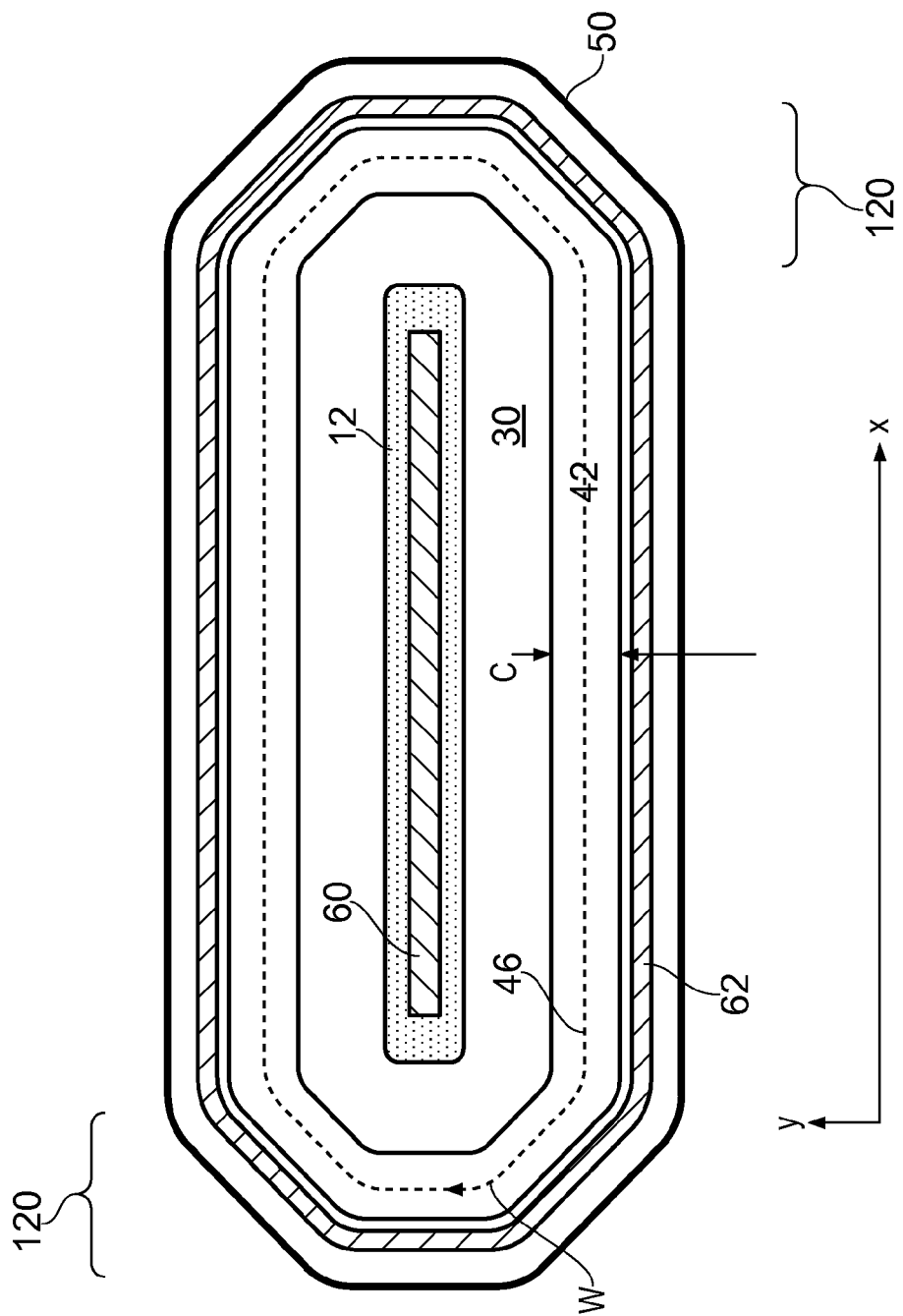
FIG. 2 is a plan view of the transistor shown in FIG. 1.

FIG. 2 is a plan view of the transistor 10 shown in FIG. 1, illustrating the spatial extent of the drain 12, the drain extension region 30, the gate electrode 42, and the back gate connection 50. FIG. 2 also shows the position of a metallic interconnect 60 overlying the highly doped region 12 of the drain, and an equivalent metallic source connection 62 over the source 14.

FIG. 2 also illustrates that the device is generally elongate with the drain region 12 being much longer in the X direction than its width in the Y direction. FIG. 2 also shows that the gate 42 forms a loop that encircles the drain as formed by the region 12 and extended drain region 30. As illustrated, the gate has a stretched annular shape and surrounds the drain. The gate has a spatial extent designated C in FIG. 2, that substantially defines the width of the channel of the transistor 10. C is typically in the range of several micrometers. In an embodiment, C was chosen to be 2 micrometers ($2 \times 10^{-6}$ m) for a 125 Volt device and 4 micrometers for a 250 Volt device. It can also be seen that the center line of the gate, as shown by a chain line 46 in FIG. 2 defines a loop around the transistor which can be described by a length W. The inventors have tested and characterized devices having values of W between 200 to 3600 microns.

Figure 3:
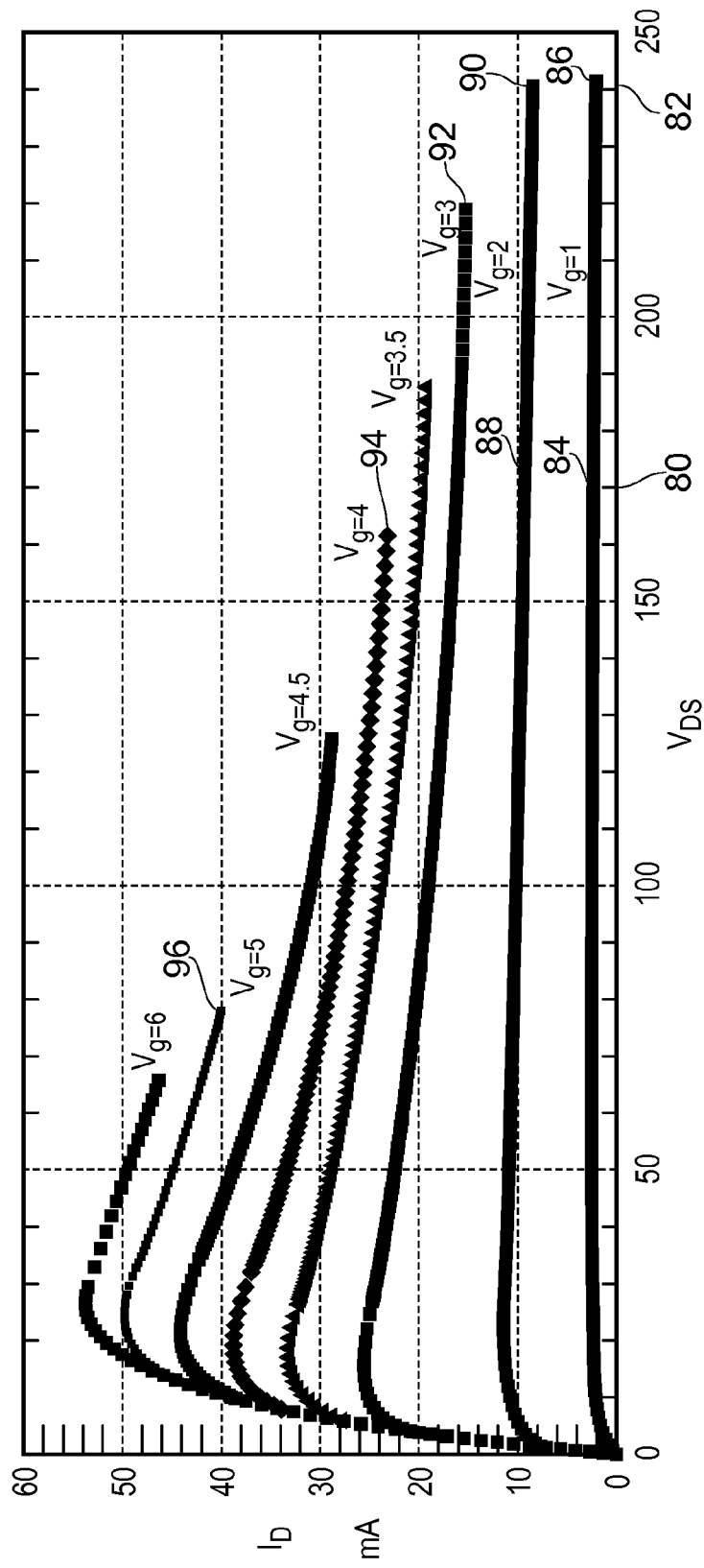
FIG. 3 is a graph showing transistor drain current at the function of the drain-source voltage of the transistor for various gate source voltages between 1 and 6 Volts, the graph also showing where on state breakdown occurs.

FIG. 3 is a graph showing the drain-source current, expressed in milliamps, versus the drain-source voltage over a range of 0 to 240 Volts for a transistor having a nominal rated operating voltage of 205 Volts (where such rating includes a safety margin of 30 to 35 Volts or so for maximum operating conditions) for gate-source voltages, Vg, between 0 and 6 volts. The device was fabricated to have a maximum gate voltage of 5 Volts. The off-state breakdown is in the region of 280 volts but the measurements were limited to a maximum drain-source voltage of 240 volts. The transfer characteristics for gate-source voltages is equal to 0 volts, 1 volt and 2 volts are illustrated by lines 80, 84 and 88 respectively up to 240 volts. Each of these response characteristics terminates with the final measurement as represented by points 82, 86 and 90 respectively, at about 240 volts while their breakdown conditions are somewhat higher. However, although the transistor exhibits good off state breakdown, it can be seen that its on state breakdown voltage starts to diminish with gate source voltages greater than 2 volts. FIG. 3 shows that for a gate-source voltage of 3 volts, breakdown occurs at approximately 215 volts as indicated by point 92, at 160 volts for a gate-source voltage of 4 volts as indicated at point 94, and at only 75 volts or so for a gate-source voltage of 5 volts as indicated by point 96. Thus the on state breakdown performance may be comparatively poor compared to the off state breakdown performance.

The inventors realized that the adoption of the circular or elliptical shape of the high voltage transistor shown in FIG. 2 had been driven by the desire to increase the breakdown voltage for transistors operating as a switch. Thus, in the off state, the transistor would see the entirety of the supply voltage or other voltage across it. However, in the on state the transistor would be acting as a low impendence switch and therefore have very little voltage across its drain and source nodes. As a result on state breakdown performance had not been significant. Furthermore, given that this style of device has successfully demonstrated reliable off state performance, and off state breakdown performance still remains desirable, then any further modification could not be to the detriment of the off state breakdown performance. From this observation, the inventors realized that the loop configuration of the gate and source in the "high voltage" transistor shown in FIG. 2 was mainly adopted as a convenient way of avoiding edge effects and similar fringing fields at the edges of conductors, and their effect on the on-state device performance had been ignored because it was not significant in the context of a transistor switch. Furthermore the inventors realized that for the elongate sections of the switch, the electric field gradients were substantially perpendicular to the elongate axis of the drain implant. However, returning to FIG. 2 it can be appreciated that the end portions generally designated 120 have electric field gradients which do not significantly run in the Y direction, but which are generally radial, and which converge at the end of the heavily doped section 12. It is also known from electrostatic analysis that the potential at the surface of a sphere increases with decreasing radius. Therefore the end portion 120, and in particular the corners, of the highly doped region 12 attracts the highest electric field gradients. These increased electric field gradients can interact with current carriers in the semiconductor lattice giving rise to regions where the combined effect of current density and electric field gradient can give rise to impact ionization driven breakdown mechanisms.

The inventors realized that the loop style structure which maintained the high breakdown voltage performance of devices in the off state contributed to reduced breakdown performance for such devices in the on state.

However they also realized that it was possible to modify the transistor so as to remove the source doping in the end portions 120 whilst maintaining the loop style gate configuration to maintain the desired off state breakdown performance, whilst also providing a mechanism for reducing current density at the ends 120 of the drain doping 12, and whilst also removing, or at the least reducing, the crowding of electric field gradients in the end portion 120.

Figure 4:
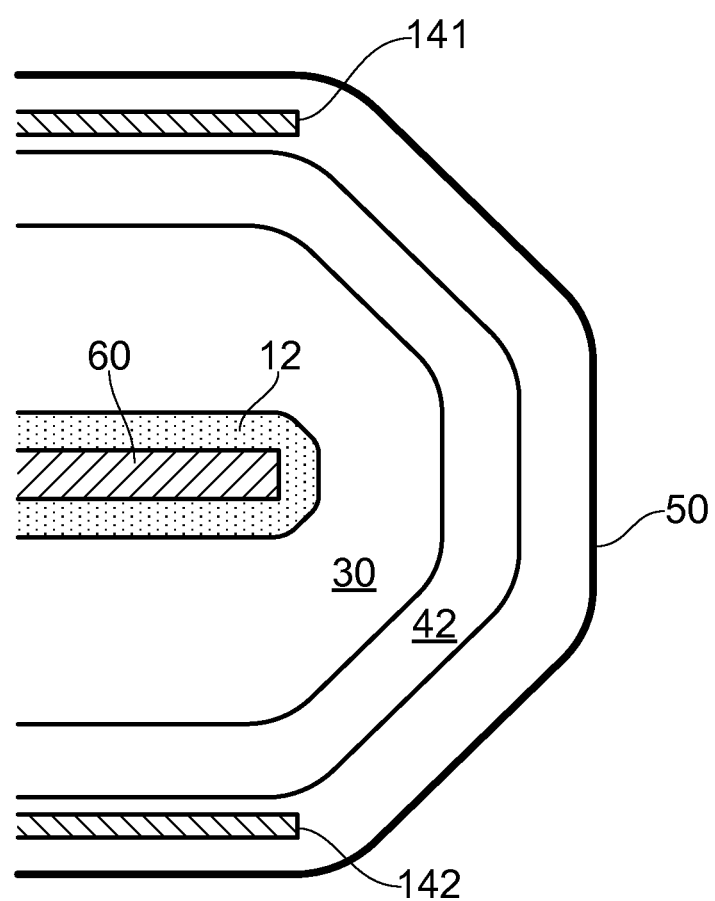
FIG. 4 is plan view showing a modification to the source of the transistor illustrated in FIG. 2 so as to improve its on state breakdown performance without detracting from its off state breakdown performance.

FIG. 4 shows the end portion 120 of the device modified in accordance with the present disclosure. Thus the highly doped region 12, and the drain extension region 30 remain as described hereinbefore with respect to FIG. 2. Similarly, the gate electrode 42, and the underlying dielectric layer 44 (not shown in FIG. 4) remain as described with respect to FIGS. 1 and 2 so as to form a loop that encircles or encloses the drain 12 of the transistor. However, the source is no longer provided as a single source doping 14 that encircles the gate 42, but rather the source is provided as first and second source implant regions 141 and 142, respectively, which are positioned parallel to and spatially aligned with the drain doping 12, such that the gate electrode 42 lies between the first source doping 141 and the drain 12, and similarly between the second source doping 142 and the drain 12. As illustrated, the first source doping region 141 and the second source doping region 142 both terminate adjacent the end portion of the drain region 12. The source is discontinuous around the gate 42 in the transistor illustrated in FIG. 4. In the example shown in FIG. 4, the end portions of the first and second drain implants align in the X direction (see FIG. 2) with the end of the drain implant 12. Thus, the end portions of the transistor have been omitted, i.e. are not active compared to the device of FIG. 2. This modification can be introduced in combination with other known structures, such as field plates, which are employed to boost breakdown voltage. In some embodiments, the transistor shown in FIG. 4 is a double-diffused metal-oxide-semiconductor (DMOS) device.

Figure 5:
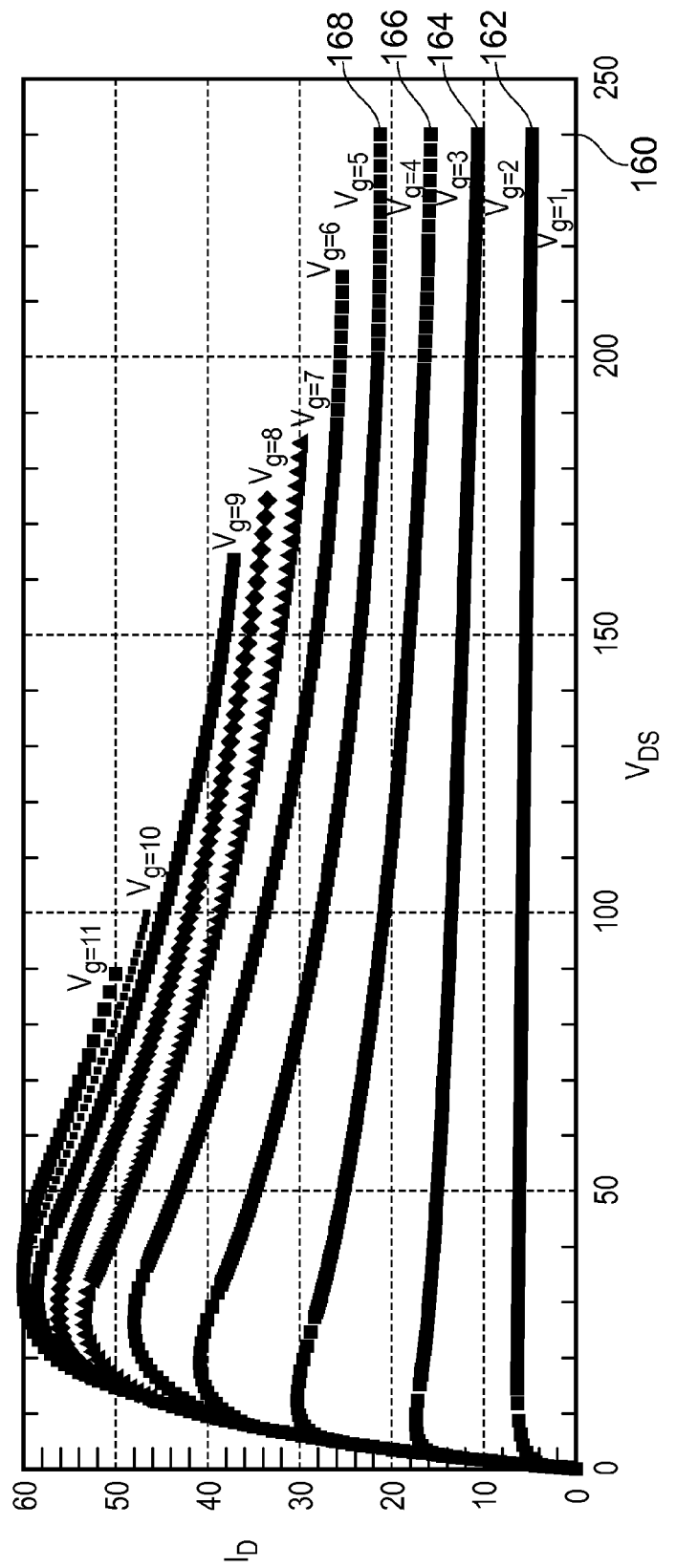
FIG. 5 is a graph showing the drain current versus drain-source voltage characteristic for values of gate voltage between 1 and 11 Volts for a transistor identical to that illustrated in FIG. 2 and whose current versus voltage characteristic was illustrated in FIG. 3, except for the fact that the transistor has its end portions modified as shown in FIG. 4.

FIG. 5 is a graph showing the drain-source current versus drain source voltage for a transistor modified as shown in FIG. 4, but otherwise identical to the transistor whose performance characteristics are shown in FIG. 3. A significant change to note is that the maximum achievable operation of the device, as illustrated by points 160, 162, 164, 166 and 168 for gate source voltages of 1, 2, 3, 4 and 5 Volts respectively are all substantially above 240 Volts (the test being terminated at 240 Volts). Thus the on state breakdown voltage is substantially increased and now approaches the off state breakdown voltage. In fact, even if the gate-source voltage increased to 7 Volts, being some 40% over the design gate-source maximum voltage, then the transistor breakdown voltage has only reduced to around 185 Volts. This compares favorably with the performance of the transistor shown in FIG. 2. However, it can be seen that this improvement in on state breakdown voltage can result in a slight reduction of the drain-source current for the transistor. Thus, at a drain-source voltage of 100 Volts and a gate-source voltage of 4 Volts, the drain current for the known design of transistor is approximately 27 milliamps, whereas for the modified device it is reduced to approximately 22 milliamps. If the known device were driven from a 5 Volt gate signal, it would have broken down whereas the device as modified in accordance with the teachings of this disclosure is intact and functional.

Preliminary analysis suggests that this reduction in the drain source current is linked to the reduction in the effective length of the source, by virtue of the source having been shortened. If space is available on the die, then this space driven reduction in current can be corrected by increasing the length of the transistor.

If space on the semiconductor die to fabricate the transistor is highly constrained, to the extent that it is infeasible to allocate more space to the transistor or, that insufficient additional space can be allocated to make up for the reduction in drain-source current, then it becomes possible to trade off the increase in on state breakdown voltage against the decrease in current carrying capacity for a given gate-source voltage by extending the source diffusions, either by the addition of additional linear sections or by the addition of sections that are accurate or which approximate an arc like shape. Additionally or alternatively it may also be possible to make third and fourth source implants separated from the first and second source implants, but galvanically connected to the first and second source implants by way of an interconnect layer (not shown).

Figure 6:
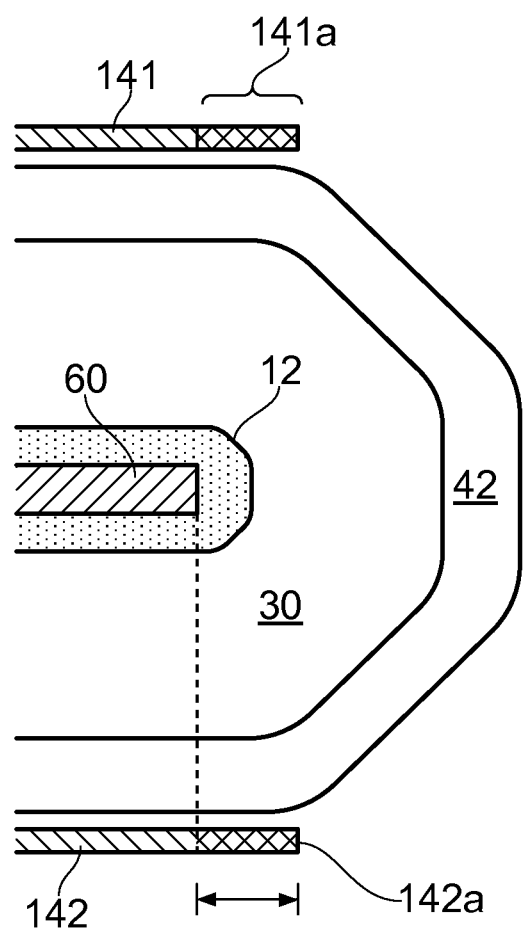
FIG. 6 shows a modification to the end portion of the transistor shown in FIG. 4.

FIG. 6 illustrates a modification to the arrangement in FIG. 4, whereby the positions at which end regions in the profiles of the extended drain region 30 and of gate 42 have been moved to extend past the end of the highly doped drain region 12, and similarly the first and second source implants 141 and 142 have also been extended by the addition of extension regions 141A and 142A. These additional sections of source implant allow more current to flow between the source and the drain whilst not excessively increasing the electric field density at the edges of the highly implanted region 12. This allows for a blending of the characteristic of the unmodified transistor (as shown in FIG. 2) with that of the modified transistor (as shown in FIG. 4), such that the resulting transfer characteristic is a mixture of the two individual responses.

Figure 7:
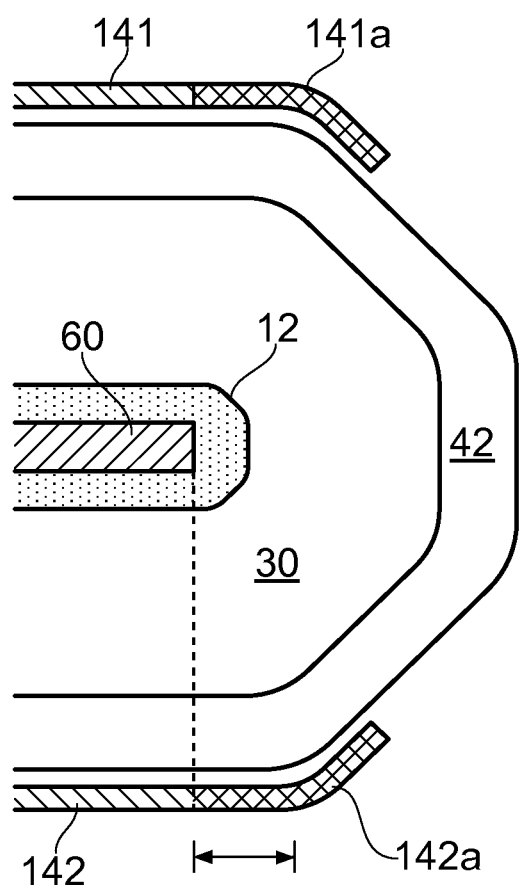
FIG. 7 shows a further modification to the end portion.

In a further modification, either in addition to that shown in FIG. 4 or in addition to that shown in FIG. 6, the extension sections may be provided in an arcurate or piecewise approximation to an arc so as to extend them further, as shown in FIG. 7, and/or additional implants may be provided substantially aligned with the axis of the highly doped region 12.

Figure 8A:
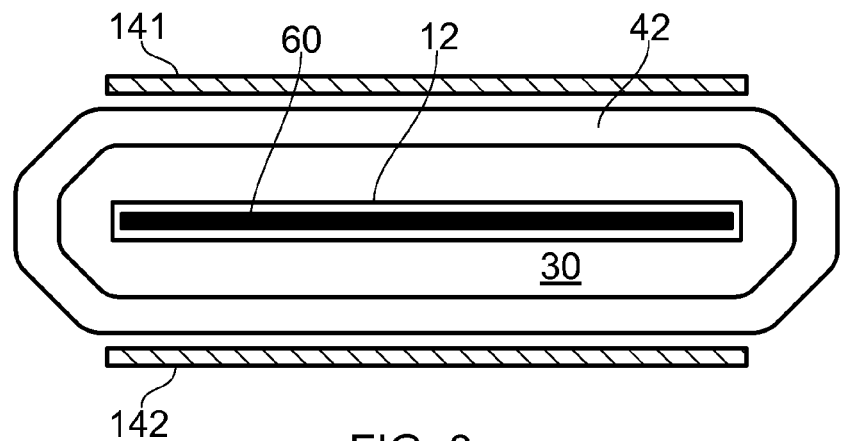
FIG. 8a shows a plan view of a transistor having a first aspect ratio as formed in accordance with the teachings of this disclosure.

The advance that the present teachings provide in terms of breakdown performance is quite marked, even in respect of devices that have a much reduced aspect ratio. Thus, the comparisons so far have been performed in respect of a device substantially as shown in FIG. 8a and having a gate length W of 500 microns, whereas the performance of a device having an aspect ratio in FIG. 8b and a gate length W of 200 microns will be discussed with respect to FIGS. 9 and 10. For completeness, a device having the same aspect ratio as that shown in FIG. 8b but not constructed in accordance with the teachings of this disclosure is illustrated in FIG. 8c.

Figure 8B:
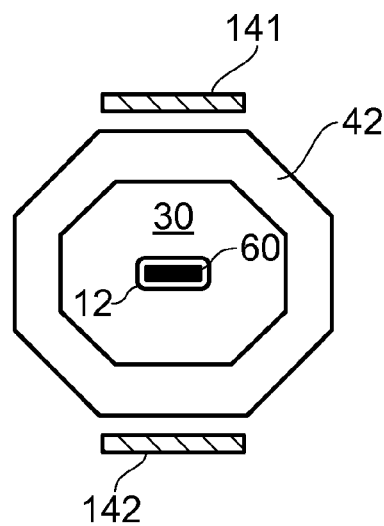
FIG. 8b shows a plan view of a transistor having a second aspect ratio as formed in accordance with the teachings of this disclosure.
Figure 8C:
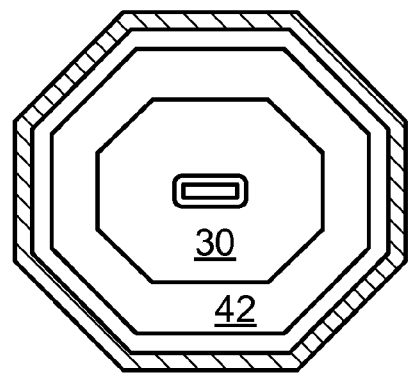
FIG. 8c is a plan view of a prior art transistor having the same aspect ratio as that shown in FIG. 8b.
Figure 9:
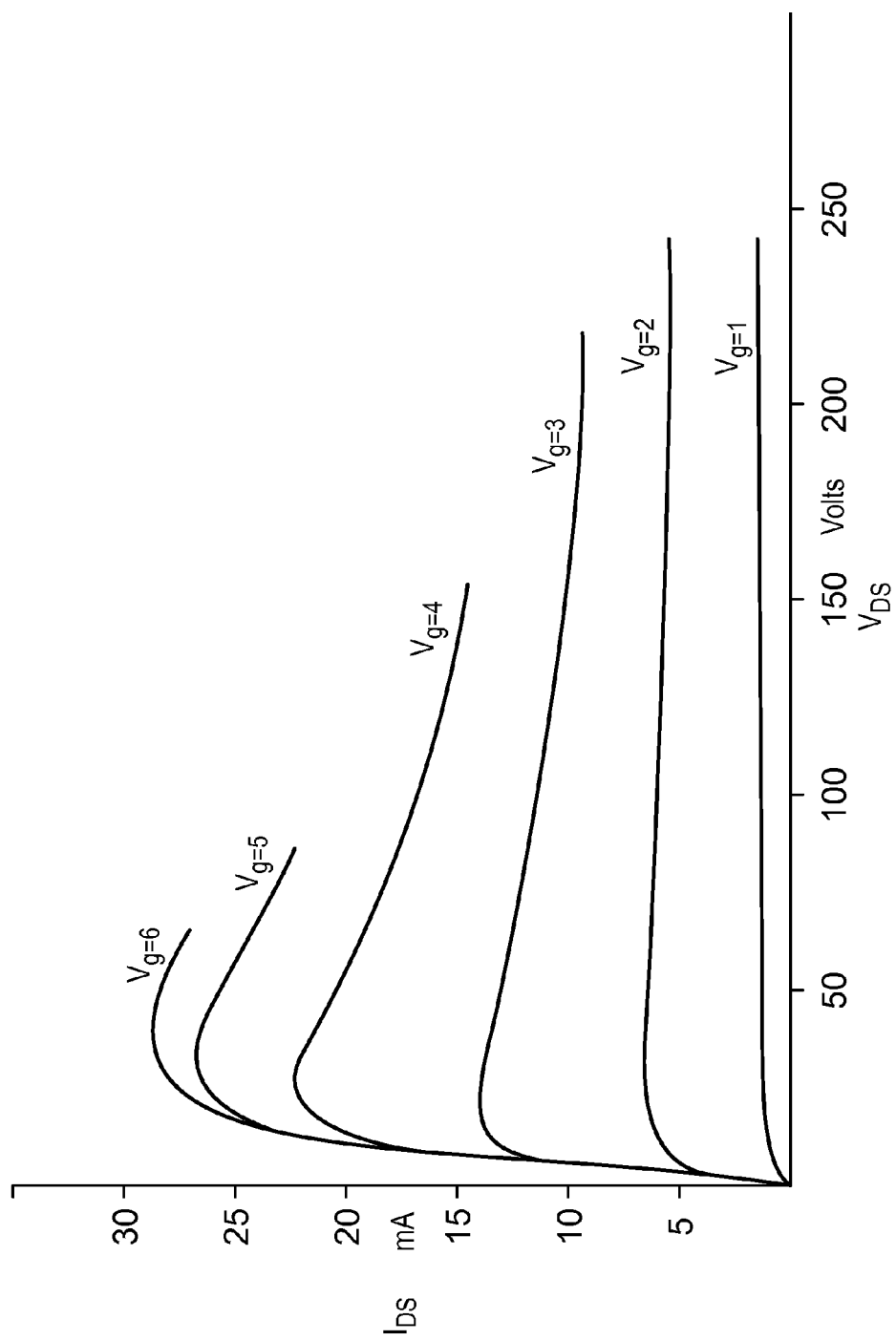
FIG. 9 plots the drain current versus drain-source voltage for the transistor of FIG. 8c, for various gate-source voltages, with the curves finishing when transistor breakdown occurs.

FIG. 9 plots the characteristics of the prior art transistor of FIG. 8c, showing current flow versus drain-source voltage for various gate-source voltages. Thus for the gate voltage of 4 volts the transistor can pass up to 15 mA at a drain-source voltage of around 150 V, but the transistor breaks down by 160 V.

Figure 10:
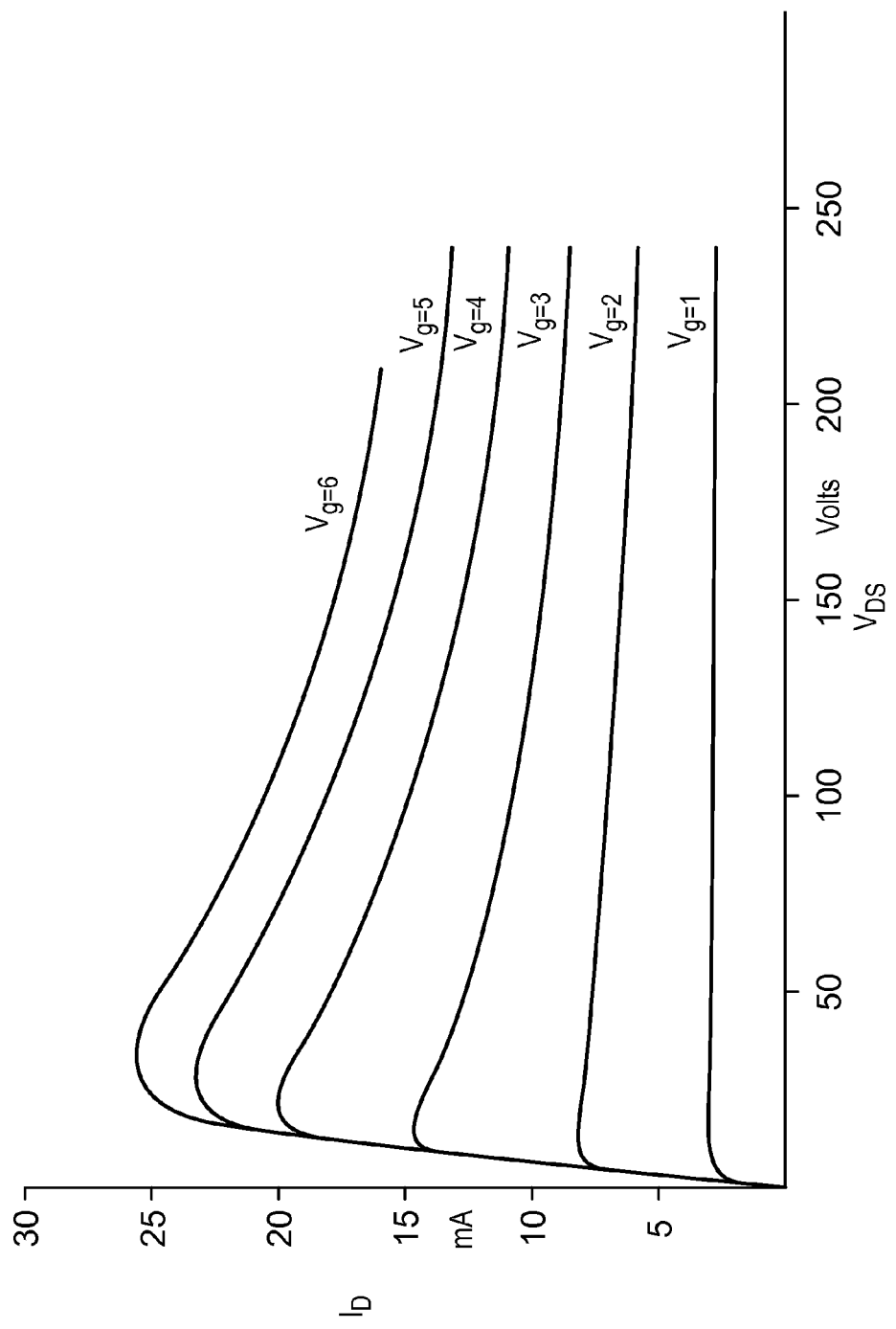
FIG. 10 plots the drain current versus drain-source voltage for the transistor of FIG. 8b, for various gate-source voltages with the curves finishing when transistor break-down occurs.

This can be compared, as shown in FIG. 10, with the characteristics of the device of FIG. 8b, which has the same footprint but where the end portions of the source have been omitted. For a gate voltage of 4 volts, the on-state breakdown voltage has increased from around 160 V for the device of FIG. 8c to 240 V for the device of FIG. 8b, but the current drain current at $V_{DS}$ of 150 V has decreased from 15 mA for the device of FIG. 8c to 10 mA for the device of FIG. 8b.

Figure 11:
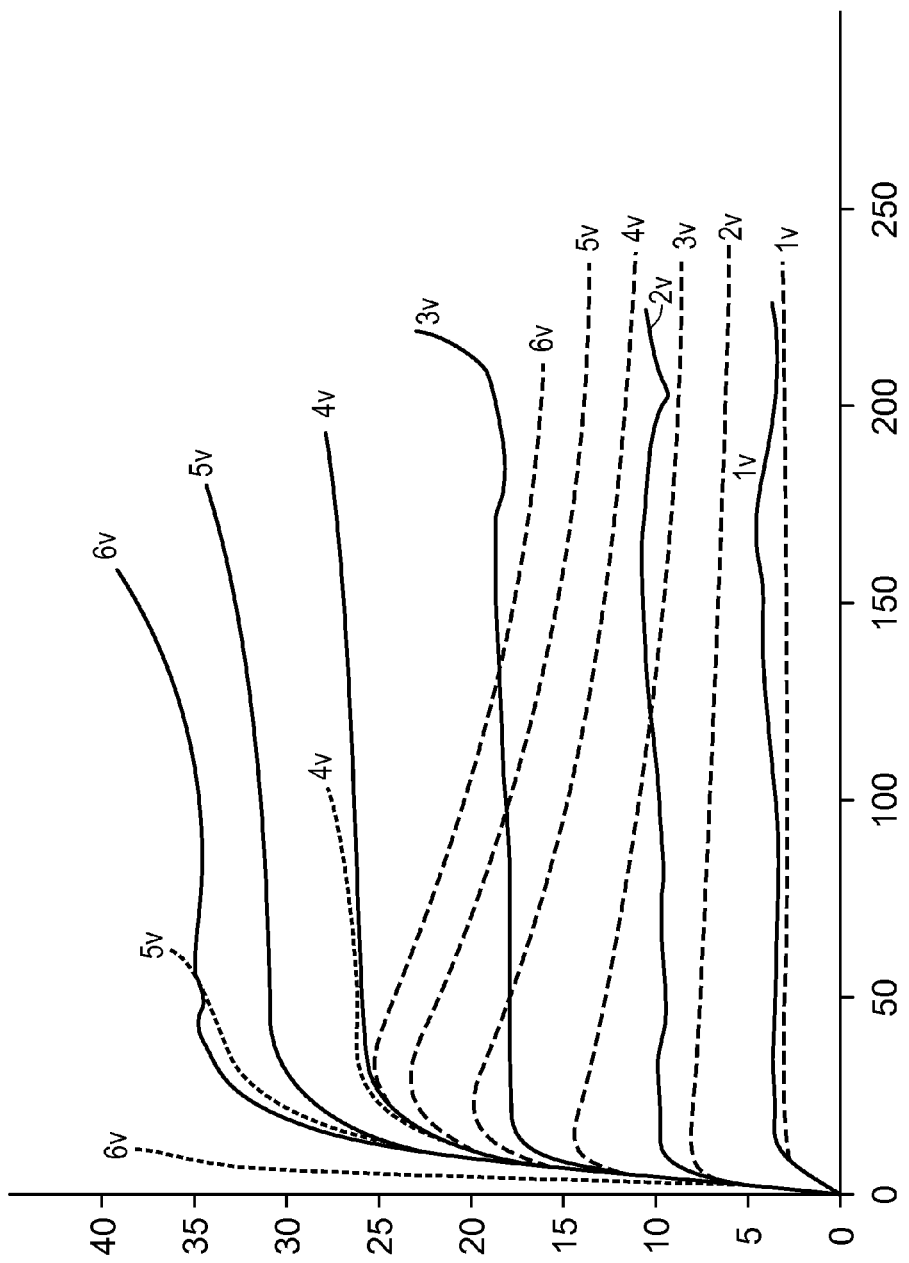
FIG. 11 shows the performance characteristics of a transistor constituting an embodiment of this disclosure in continuous and pulsed modes.

The pulsed performance of transistors manufactured in accordance with the teachings of this disclosure is also improved. FIG. 11 shows the pulsed and DC performance of a transistor formed in accordance with the teachings of the disclosure in continuous operation and in a pulsed mode with a pulse width of 100 nanoseconds and a repetition rate of 1000 times per second. The pulsed operation removes any significant joule heating component from the breakdown characteristic. The continuous response is shown by the broken chain line whereas the pulsed response characteristic is shown by the solid line.

By way of comparison, the equivalent characteristic for an equivalent prior art device formed with the same aspect ratio but not in accordance with the teachings of this disclosure is shown by the dotted lines for Vg of 6 V, 5 V and 4 V. It can be seen that the prior art device breaks down at around 100 V in pulsed operation, but the device of the present disclosure functions to about 200 V in pulsed mode.

Figure 12:
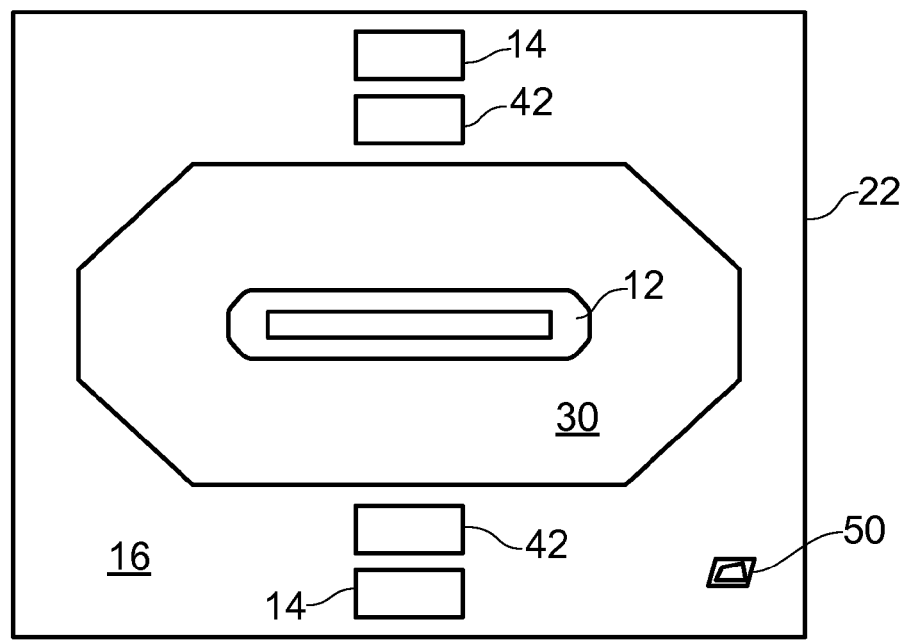
FIG. 12 shows a plan view of a further embodiment.

FIG. 12 shows a further variation of a transistor in accordance with this disclosure. In FIG. 12 the extent of the gate is shortened relative to the drain 12 such that the ends of the highly doped drain region 12 extend past the active channel of the transistor. Thus little of the current flows via the end portions and hence there is a little risk of impact ionization driven breakdown occurring.

The source 14 has been illustrated as being truncated to be substantially that of the length of the gate, but equally the source could extend past the gate, and may be formed as an annulus as shown in FIGS. 1 and 2.

It is thus possible to increase the on-state breakdown voltage of a transistor formed with a given fabrication process or footprint.

Figure 13:
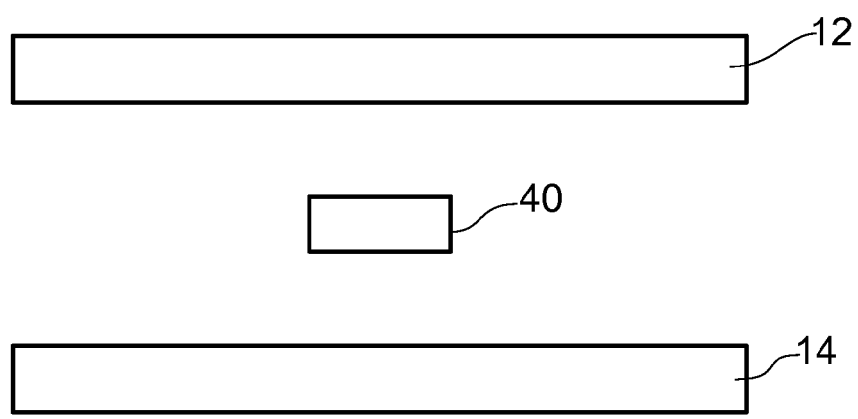
FIG. 13 shows a plan view of a further embodiment.

FIG. 13 shows a further variation of a transistor in accordance with this disclosure. In FIG. 13 the drain 12 and source 14 are disposed either side of a gate 40, but the gate 40 is significantly shorter than either of the drain and source and positioned such that it is not near end regions of either the drain and source. This prevents a channel being formed adjacent end regions of the drain or the source and consequently reduces current density in those end regions. Thus, whilst electric field gradients may still be greater at the end regions of the drain and the source, current flow will be significantly reduced, and both of these factors combine to give rise to impact ionization driven breakdown. Thus reducing the current flow reduces the risk of breakdown, and consequently raises the voltage that the transistor can withstand before breakdown occurs.

Figure 14:
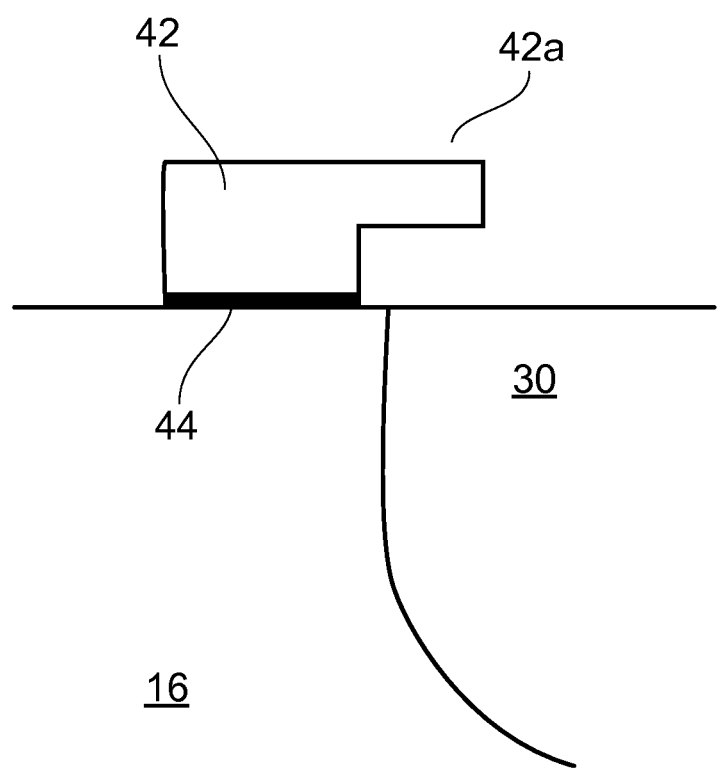
FIG. 14 illustrates a field plate that can be implemented in connection with embodiments of the transistors described herein.

FIG. 14 illustrates that the gate electrode may be profiled to extend it towards the drain by the addition of a conducting section 42a that serves as a field plate. Such a field plate is displaced from the surface of the semiconductor, and may be deposited over a dielectric (not illustrated). The field plate can be implemented in connection with any of the embodiments discussed herein.

Although the examples given herein have been with respect to N type Field effect transistors, the techniques described here can be applied to P type devices. The transistors provide improved breakdown performance either as discrete devices or within integrated circuits.

The principles and advantages described herein can be implemented in various apparatus. Examples of such apparatus can include, but are not limited to, consumer electronic products, parts of the consumer electronic products, electronic test equipment, wireless communications infrastructure such as a cellular base station, etc. Consumer electronic products can include, but are not limited to, wireless devices, a mobile phone (for example, a smart phone), a telephone, a television, a computer, a hand-held computer, a wearable computer, a tablet computer, a laptop computer, a watch, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments have been described, these embodiments have been presented by way of example, and are not intended to limit the scope of the disclosure. Indeed, the novel methods, systems, and apparatus described herein may be embodied in a variety of other forms. Furthermore, various omissions, substitutions and changes in the form of the methods and appartus described herein may be made without departing from the spirit of the disclosure. The accompanying claims and their equivalents are intended to cover such forms or modifications as would fall within the scope and spirit of the disclosure.

The claims presented here are in single dependent format suitable for use at the USPTO, however it should be understood that each claim may depend from any preceding claim of the same type except when that is clearly infeasible.

What is claimed is:

1. A transistor comprising:
   a first region of semiconductor having an elongate shape in plan view, the first region of semiconductor having a side portion and two end portions;
   a first extension region having the same conductivity type as the first region;
   a second region of semiconductor extending around the side portion of the first region of semiconductor and being discontinuous adjacent each of the two end portions of the first region of semiconductor;
   a gate located between the first and second regions of semiconductor; and
   a third semiconductor region having an opposite conductivity type than the first region of semiconductor, the third semiconductor region extending approximately the same distance away from the side portion of the first semiconductor portion and the end portion of the first semiconductor region in plan view; and
   wherein an interface between the first extension region and the third semiconductor region is below the first region of semiconductor in cross-sectional view and the interface extends through a vertical axis that passes through the first region of semiconductor in cross-sectional view.

2. A transistor as claimed in claim 1, in which the first region has a first length, the second region has a second length and the gate has a third length greater than the first length and greater than the second length.

3. A transistor as claimed in claim 1, in which the first region has a first length, the second region has a second length and the gate has a third length or extent, and the gate is shorter or less extensive than the first and second regions.

4. A transistor as claimed in claim 3, in which the gate is positioned such that it does not form a channel in the vicinity of ends or one or both of the first and second regions.

5. A transistor as claimed in claim 1, in which the gate is formed as a structure that encircles or substantially encircles the first region of semiconductor.

6. A transistor as claimed in claim 5, in which the second region of semiconductor does not completely encircle or does not substantially encircle the gate.

7. A transistor as claimed in claim 1, in which the transistor has a gate with a stretched annular shape around a stretched annular drain, wherein sections of a source are missing adjacent opposing ends of the stretched annular drain, wherein the stretched annular drain comprises the first region of semiconductor, and wherein the source comprises the second region of semiconductor.

8. A transistor as claimed in claim 1, in which the first region of semiconductor comprises a first type of semiconductor formed as an island within and surrounded by the third semiconductor region.

9. A transistor as claimed in claim 8, in which the first region of semiconductor functions as a drain of the transistor, and the source of the transistor is comprised of the second region of semiconductor which forms a first source region, and a further region of semiconductor which forms a second source region, and wherein the first and second source regions are parallel to and disposed on opposing sides of the drain of the transistor such that the first and second source regions do not abut one another.

10. A transistor as claimed in claim 9 further comprising arcurate or stepwise approximations to arcurate or polygonal end sections at the ends of the first and second source regions.

11. A transistor as claimed in claim 1, further comprising a field plate having a race-track like shape extending from the gate towards the drain.

12. A transistor as claimed in claim 1, further comprising an insulating layer, wherein the first extension region and the second region are each separated from the insulating layer, and wherein the third semiconductor region is disposed between the first extension region and the insulating layer.

13. A transistor as claimed in claim 1, comprising a drain which is longer in a first direction than in a second direction and disposed between at least first and second source dopings which are not contiguous with one another.

14. A transistor as claimed in claim 1, in which the first extension region has a reduced doping concentration relative to the first region, and wherein the first region of semiconductor, the first extension region, the third region of semiconductor, and an insulating layer are arranged in order along the vertical axis.

15. A transistor as claimed in claim 1, in which the first region is the drain of the transistor and has a first length which is greater than a length of the gate of the transistor.

16. A transistor as claimed in claim 15, in which the two end portions lie within an extension region that extends around the two end portions to reduce electrostatic gradients at the end region.

17. An integrated circuit including at least one transistor as claimed in claim 1.

18. A transistor as claimed in claim 8, in which the first region of semiconductor is elongate and functions as a source of the transistor, and the drain of the transistor is comprised of the second region which forms a first drain region and a further region of semiconductor which forms a second drain region, and where the first and second drain regions are parallel to and disposed on opposing sides of the source of the transistor, and the first and second drain regions do not abut one another.

19. The transistor as claimed in claim 1, wherein the second region of semiconductor is longer than the first region of semiconductor.

20. A field effect transistor comprising:
    a drain having an elongate shape in plan view, the drain including a side portion and two end portions;
    a drain extension region that extends below the drain;
    a source including one or more doped regions, the one or more doped regions extending around the side portion of the drain and being discontinuous adjacent each of the two end portions of the drain; and
    a gate disposed between the source and the drain, the gate surrounding the drain in plan view; and
    a body region having an opposite conductivity type than the drain, wherein an interface between the body region and the drain region extends approximately the same distance away from the side portion of the drain and the end portion of the drain in plan view; and wherein the interface is also located below the drain in cross-sectional view, the interface extending through a vertical axis that passes through the drain in cross-sectional view.

21. A transistor comprising:

a first region of semiconductor having an elongate shape in plan view, the first region of semiconductor having a side portion and two end portions;

a second region of semiconductor; and a gate located between the first and second regions of semiconductor;

wherein the second region of semiconductor extends around the side portion of the first region of semiconductor, and the second region of semiconductor is longer than the first region of semiconductor; and wherein the second region of semiconductor is discontinuous adjacent each of the two end portions of the first region of semiconductor; and wherein the second region of semiconductor comprises arcurate or stepwise approximations to arcurate or polygonal end sections where the second region is discontinuous.

* * * * *